US006455352B1

(12) United States Patent
Pikarsky et al.

(10) Patent No.: US 6,455,352 B1
(45) Date of Patent: Sep. 24, 2002

(54) PIN ARRAY ASSEMBLY AND METHOD OF MANUFACTURE

(75) Inventors: Joel Pikarsky, Chicago, IL (US); Peter Hesketh, Atlanta, GA (US); Gennadiy Yershov, Hinsdale, IL (US)

(73) Assignee: The University of Chicago, Chicago, IL (US)

(*) Notice: Subject to any disclaimer, the term of this patent is extended or adjusted under 35 U.S.C. 154(b) by 0 days.

(21) Appl. No.: 09/653,672

(22) Filed: Sep. 1, 2000

(51) Int. Cl.[7] .......... H01L 21/44

(52) U.S. Cl. .......... 438/109; 257/48; 438/14; 438/50; 422/100

(58) Field of Search .......... 422/100; 257/48; 436/180, 50

(56) References Cited

U.S. PATENT DOCUMENTS 5,756,050 A * 5/1998 Ershow et al. .......... 422/100
5,962,329 A * 10/1999 Ershov et al. .......... 436/50
6,024,925 A * 2/2000 Little et al. .......... 422/100
6,051,190 A * 4/2000 Birch et al. .......... 422/100
6,072,190 A * 6/2000 Watanabe et al. .......... 257/48
6,228,659 B1 * 5/2001 Kowallis et al. .......... 436/180
6,255,119 B1 * 7/2001 Baier .......... 436/180
6,303,387 B1 * 10/2001 Birch et al. .......... 436/180

* cited by examiner

*Primary Examiner*—David Nelms
*Assistant Examiner*—Mai-Huong Tran
(74) *Attorney, Agent, or Firm*—Joan Pennington

(57) ABSTRACT

An improved pin array assembly and method of manufacture of the pin array assembly are provided. A pin array assembly includes a single crystal silicon wafer. The single crystal silicon wafer is formed to define a base and an array of pins. Each of the pins has a shaft and a tip surface. The pin shaft is hydrophobic and the pin tip surface is hydrophilic. The method of manufacture of the pin array assembly includes the steps of forming an initial shape of a single crystal silicon wafer to define a base and an array of pins. The initial shape of a single crystal silicon wafer is etched and the array of pins is polished. The step of forming an initial shape of a single crystal silicon wafer to define a base and an array of pins includes mechanically sawing the single crystal silicon wafer to define a base and an array of pins. Chemical treatment of the pins is performed to make the shaft of the pins hydrophobic and to make the pin tip surfaces hydrophilic.

17 Claims, 6 Drawing Sheets

PIN ARRAY ASSEMBLY AND METHOD OF MANUFACTURE

The United States Government has rights in this invention pursuant to Contract No. W-31-109-ENG-38 between the United States Government and Argonne National Laboratory.

FIELD OF THE INVENTION

The present invention generally relates to a pin array assembly and method of manufacture; and more particularly relates to a single crystal silicon pin array assembly and method of manufacture of the single crystal silicon pin array assembly.

DESCRIPTION OF THE RELATED ART

Current pin array assemblies used to transfer material from a reservoir to another surface substrate such as a membrane or a lay out of gel micro matrices are subject to deformation during the loading process. As a result of bending of the individual pins, problems with the solution transfer result. A need exists for very precise solution transfer and that the resulting geometry of the solutions on the substrate will be uniform. In addition to spacing requirements of the pins in the pin assembly, there are also certain chemical characteristics that are very important. For example, it is necessary that the pin ends that come in contact with the solutions, are hydrophilic; while the sides of each pen must be hydrophobic. These requirements restrict the drop of solution to the end of the pin, so that there is no danger that the drop of solution will roll down the sides of a pin in the array.

A principal object of the present invention is to provide an improved pin array assembly and method of manufacture of the pin array assembly.

It is another object of the present invention to provide such an improved pin array assembly and method of manufacture of the pin array assembly where the potential for bending of individual pins is minimized.

It is another object of the present invention to provide such an improved pin array assembly and method of manufacture of the pin array assembly enabling very precise solution transfer and generally uniform geometry of the solutions on the pin array assembly.

It is another object of the present invention to provide such an improved pin array assembly and method of manufacture of the pin array assembly where pin ends are hydrophilic while pin sides are hydrophobic.

It is another object of the present invention to provide such an improved pin array assembly and method of manufacture of the pin array assembly where the pin array assembly is generally easy to make.

SUMMARY OF THE INVENTION

In brief, an improved pin array assembly and method of manufacture of the pin array assembly are provided. A pin array assembly includes a single crystal silicon wafer. The single crystal silicon wafer defines a base and an array of pins. Each of the pins has a shaft and a tip surface. The pin shaft is hydrophobic and the pin tip surface is hydrophilic.

The method of manufacture of the pin array assembly includes the steps of forming an initial shape of a single crystal silicon wafer to define a base and an array of pins. The initial shape of a single crystal silicon wafer is etched and the array of pins is polished.

In accordance with features of the invention, the step of forming an initial shape of a single crystal silicon wafer to define a base and an array of pins includes mechanically sawing the single crystal silicon wafer to define a base and an array of pins. Potting of the pin array in wax allows all pins to be made the same length and also allows the plane of the tips of the pins to be made coplanar with the base. Chemical treatment of the pins is performed to make the shaft of the pins hydrophobic and to make the tip surfaces hydrophilic.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
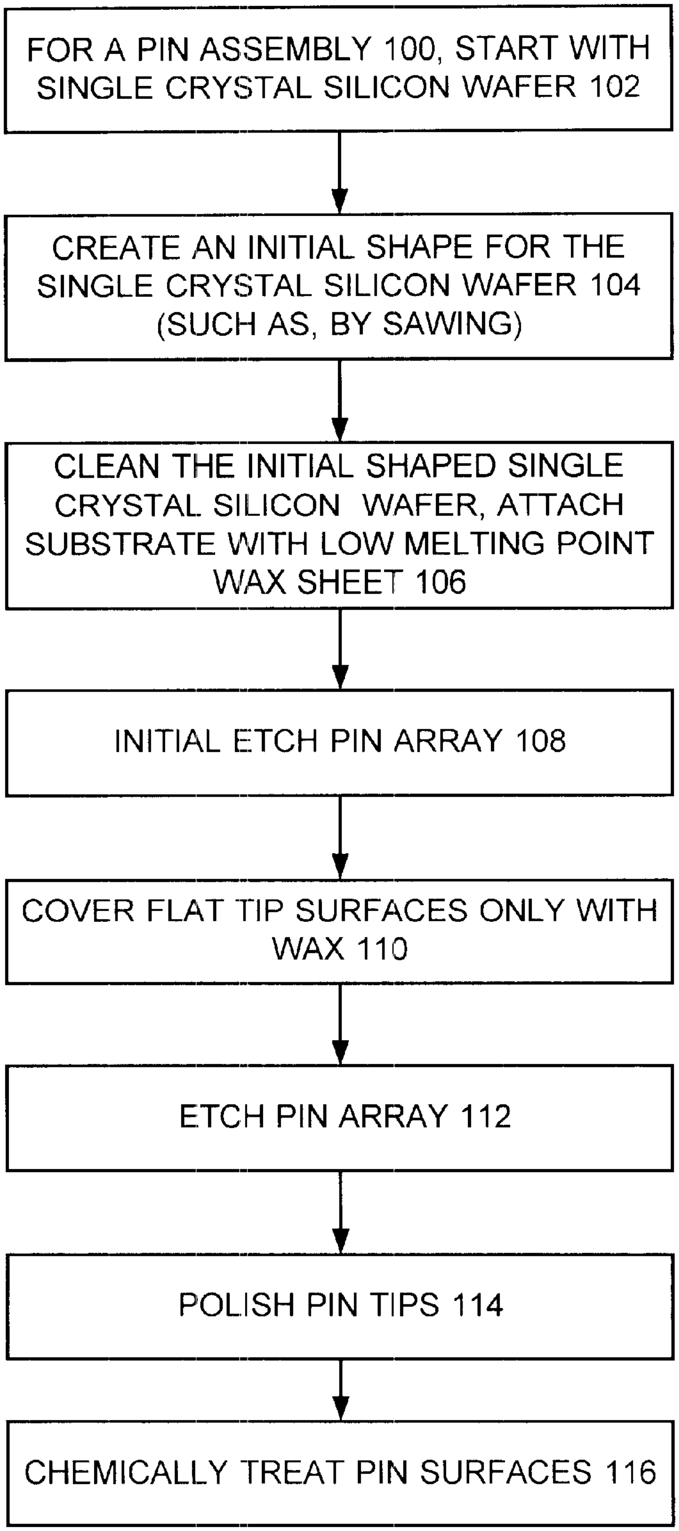
FIG. 1 is a flow diagram illustrating sequential steps of a method of manufacture of a pin array assembly of the preferred embodiment.
Figure 2A:
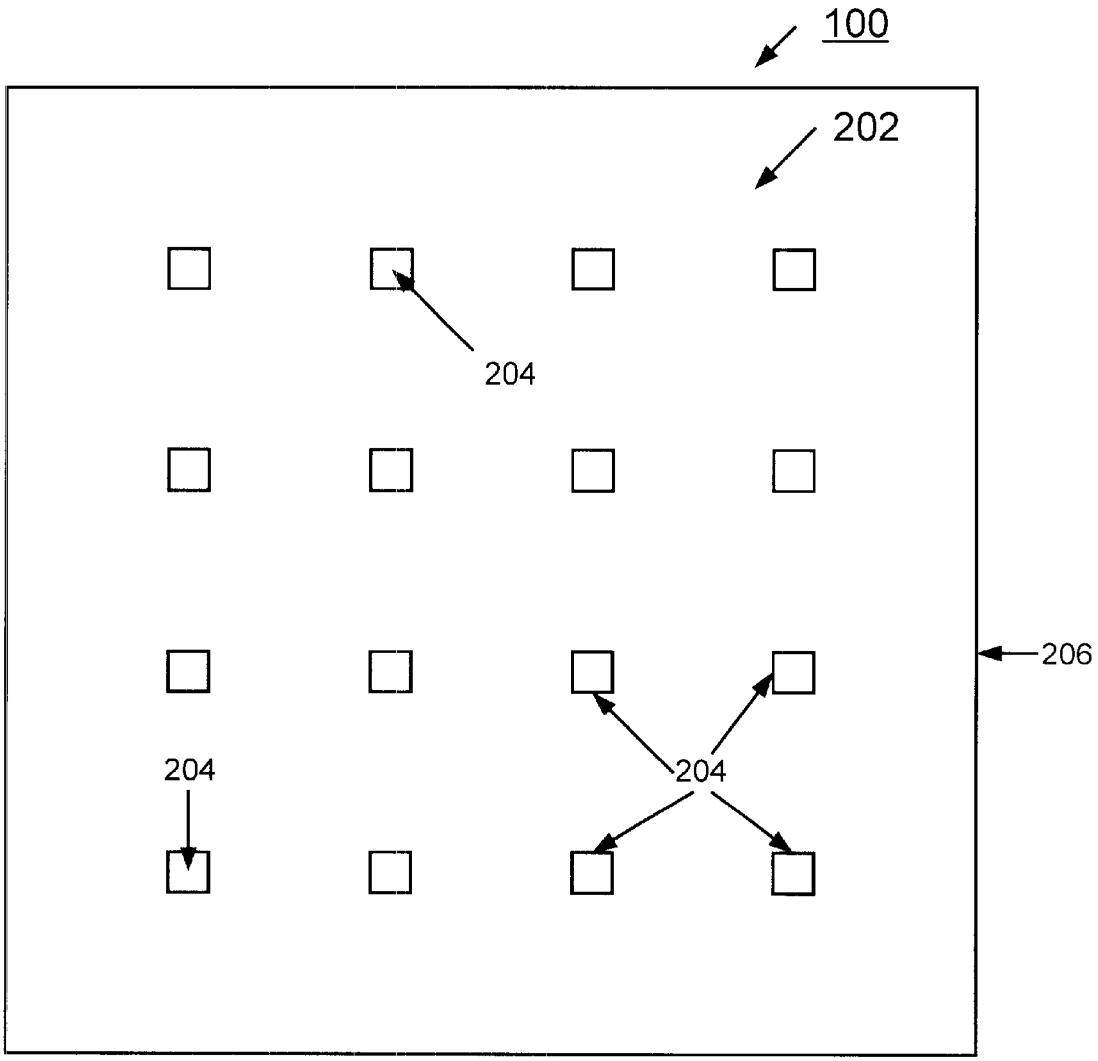
FIG. 2A is a diagram illustrating a pin array assembly of the preferred embodiment.
Figure 3:
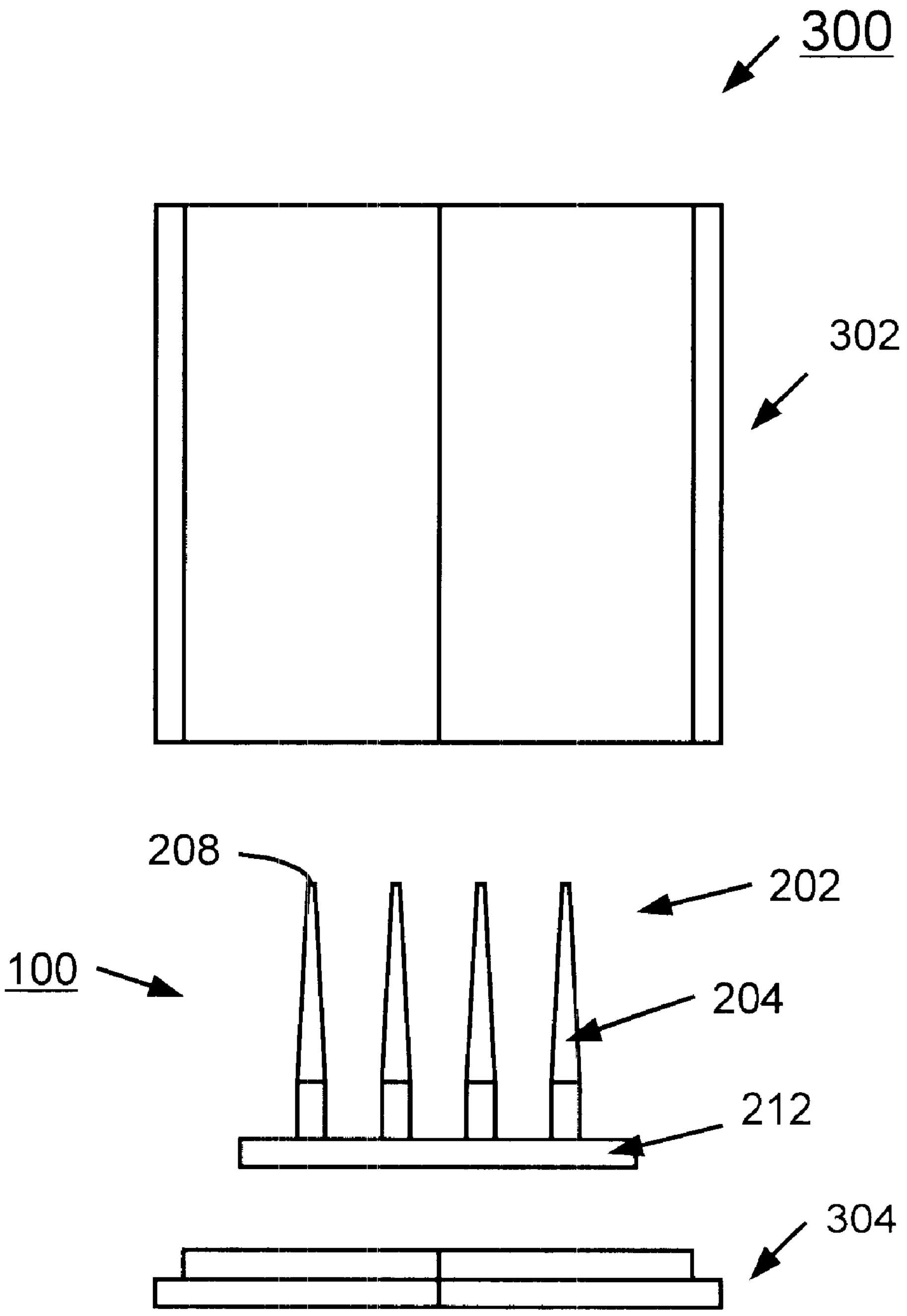
FIG. 3 is a diagram illustrating a form used to pot the pin array assembly of the preferred embodiment.
Figure 4:
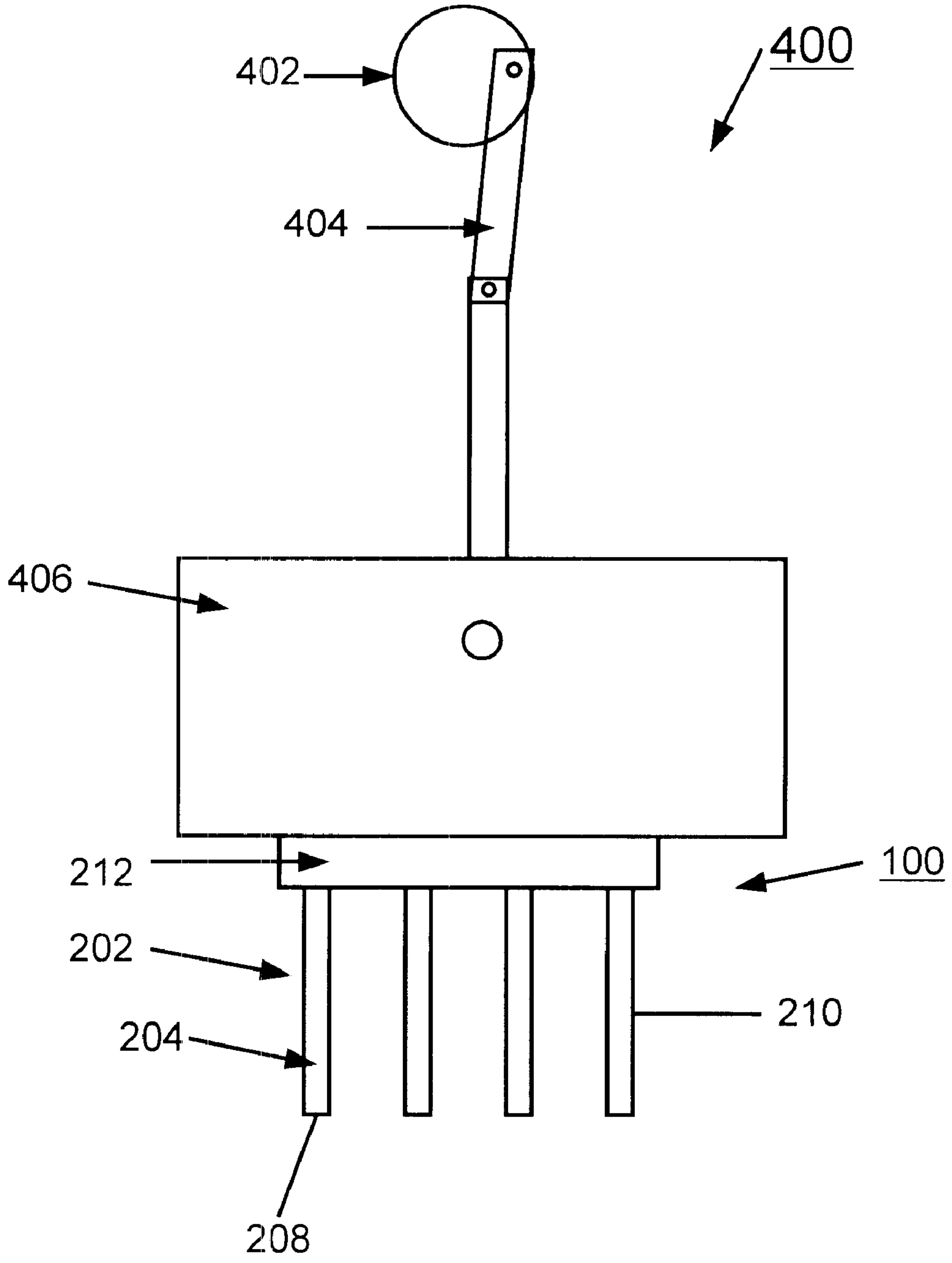
FIG. 4 is a diagram illustrating a fixture for dipping the pin array assembly of the preferred embodiment into an etch solution.

Having reference now to the drawings, in FIG. 1 there are shown sequential steps of a method of manufacture of a pin array assembly 100 of the preferred embodiment. Referring also to FIGS. 2A, 3 and 4, the pin array assembly 100 of the preferred embodiment is illustrated.

In accordance with features of the invention, the pin array assembly 100 includes an array 202 of pins 204 constructed from single crystal silicon wafer 206. Each pin 204 has a generally flat hydrophilic tip 208 and a hydrophobic shaft 210. Pins 204 extend from a base 212. A motor driven fixture 400 is illustrated in FIG. 4 for dipping the pin array 202 into an etch solution. Motor driven fixture 400 includes a motor 402 attached to a crank 404. A pin array holder 406 attached to the crank 404 receives the pin array assembly 100. The ends 208 of the pins 204 are dipped into the etch solution during a taper etch step of manufacture of a pin array assembly 100.

Two 4×4 square arrays 202 of cylindrical pins 204 with flat hydrophilic tips 208 and hydrophobic shafts 210 were constructed from single crystal silicon for the precise robotic application of small liquid volumes of approximately 1 nL. The dimension of each pin 204 was 11 mm in total length with a diameter of about 200 $\mu$m at the tip and extending down the pin about 3 mm which then widened to 500 $\mu$m at the base 212. The pins were 3 mm apart and extended from a 15 mm square base 212, 2 mm thick. A 4 inch diameter, 13 mm thick, <110>, polished one side, silicon wafer 206 was chosen as the substrate. Silicon was specified as the preferred material due to its high thermal conductivity, allowing close control of the array temperature. The <110> orientation was chosen because the fracture line along the <111> plane are either at an angle perpendicular or at 35.26 degrees to the longitudinal axis of the pins which was believed would decrease pin breakage. The <110> orientation also allows anisotropic chemical etching of deep grooves, with vertical sidewalls, with the longitudinal axes running in the <111> and <111> directions. The grooves would have vertical sidewalls due to the slow etching <111> planes perpendicular to the surface of these wafers.

The sequential steps for manufacturing the pin array assembly 100 start with a single crystal silicon wafer 206 as indicated in a block 102. As indicated in a block 104, an initial shape for the single crystal silicon wafer 206 is created, for example, by sawing. For example, the initial shape was made by sawing a 15 mm square piece from the wafer 206 and sawing many 11 mm deep cuts with a wide, coarse diamond blade to rough form the array 202 of square posts 204. This left a 2 mm thick base 212. Then a fine diamond blade was used to trim the posts to 500 $\mu$m square. This work was performed by Precision Surface Technology, Allentown, Pa.

Figure 2B:
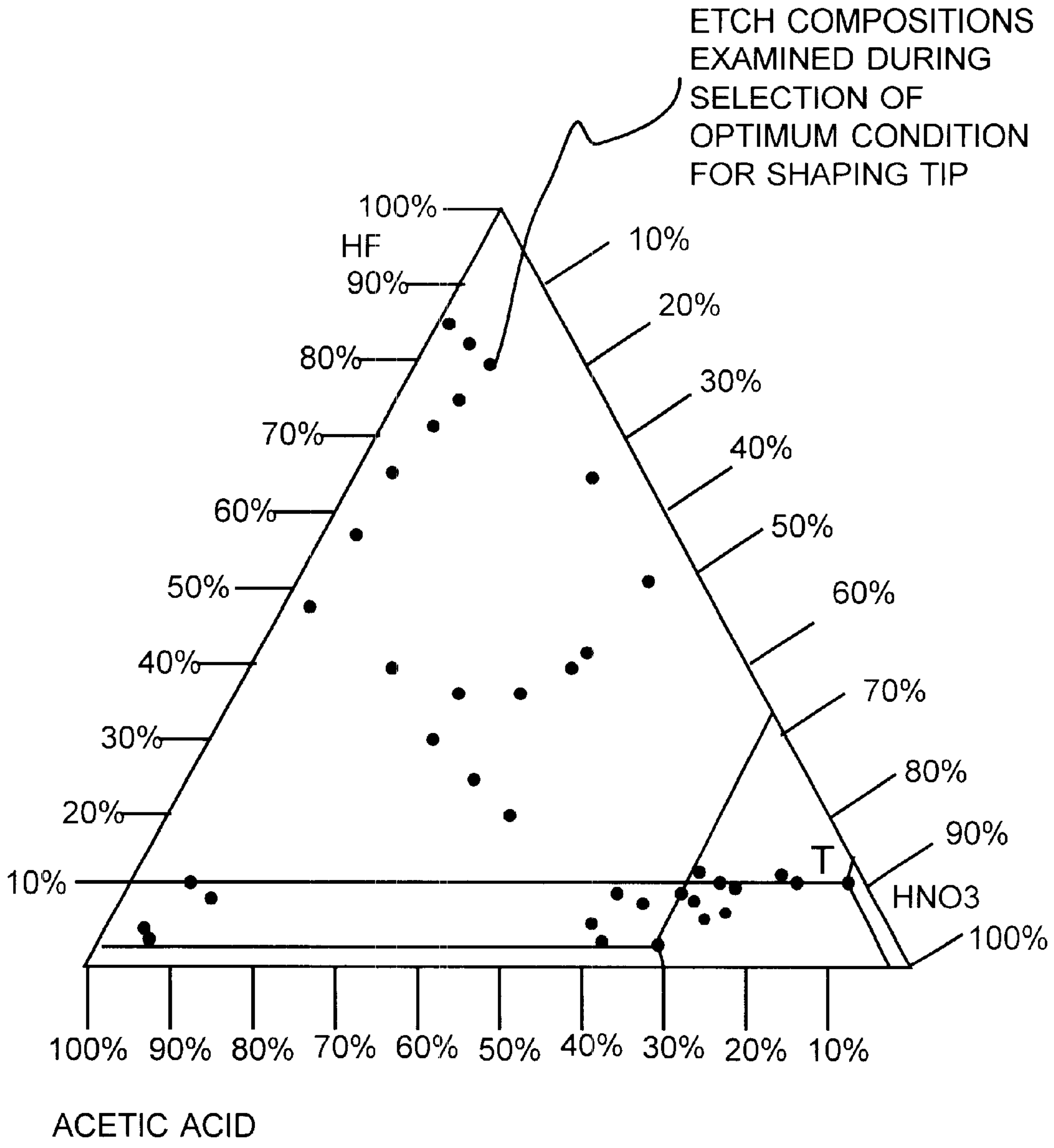
FIG. 2B is a diagram illustrating etch solutions tested in accordance with the preferred embodiment.

Referring to FIG. 2B there is shown a diagram illustrating etch solutions tested. In FIG. 2B percentages of Acetic Acid are indicated along the horizontal axis, percentages of HF and $HNO_3$ respectively are shown relative to the left and right sides of the chart. The points in FIG. 2B show various solution concentrations that were tested. The concentration indicated with a T was used for the taper etch.

Next the initial shaped single crystal silicon wafer is cleaned, then a substrate is attached with a low melting point wax sheet as indicated in a block 106. Then an initial etching of the array 202 is provided as indicated in a block 108. For example, prior to etching the array 202 was cleaned with 1 part $H_2SO_4$ (96%), to 3 parts $H_2O_2$ (30%) by volume for 5 minutes, and then attached to a 33 mm×60 mm $Al_2O_2$ substrate, such as manufactured and sold by Coors Ceramics Company, Golden, Colo., with a low melting-point, such as 80° C., wax sheet. This was done to protect the base 212 and maintain a smooth, flat surface. The array 202 was then etched in a 2 parts HF (49%), 38 parts $HNO_3$ (70%), 17 parts $CH_3COOH$ (99.5%), by volume, isotropic etching solution, for 15 minutes to remove saw damage and form an initial taper. After this, the pins 204 retained a square cross-section with some rounding of the tip edges. The dimensions of the pins 204 were approximately 400 $\mu$m square.

Next the pin tips 208 are optionally covered with a wax as indicated in a block 110. Then a taper etch of the pin array 202 is performed as indicated in a block 112. For the next etch the flat tip surfaces 208 only, were covered with black wax, for example, of a type sold by Apiezon W, Apiezon Products, Manchester, United Kingdom, to minimize shortening of the pins 204. The array 202 was attached to the motor driven fixture 400 illustrated in FIG. 4, that dipped the ends 208 of the pins 204 into an etch solution of 1 part $CH_3COOH$ (99.5%), 4 parts HF (49%), 35 parts $HNO_3$ (70%) and this solution contains an FC-99 surfactant. Pins 204 were dipped to a depth of 5 mm at a rate of 40 dips/minute for 12 minutes. Pins 204 showed a "waist" effect, the pin narrowed to a very thin, rectangular cross-section near the tip 208 and then widened to nearly the original tip width. The pins also showed a pronounced rippling where they had been dipped in the etch solution. After etching the array 202 and the $Al_2O_3$ substrate were heated to separate them. The black wax was removed by soaking the pin array 202 in toluene at 80° C. for 20 minutes followed by soaking in Summa Clean supplied by Ashland Chemical, Columbus, Ohio, at 80° C. for 5 minutes. To eliminate the rippling of the pins 204, a surfactant was added to the etch solution. The surfactant was FC-99 that was sold by the 3M Company of St. Paul, Minn., a fluoropolymer solution that does not break down in strong acids. The FC-99 surfactant has been discontinued by the 3M Company; however, various other surfactants can be used. Etch solution was 2 parts FC-99 (25%), 5 parts $CH_3COOH$ (99.5%), 20 parts HF (49%), 175 parts $HNO_3$ (70%). This is the maximum effective concentration. Lesser concentrations were ineffective.

Next the pin tips 208 are polished as indicated in a block 114. In order to make all pins 204 uniform in length with flat tips the array was potted in wax, such as a generic investment casting wax and the tips 208 polished.

Referring also to FIG. 3, a form 300 used to pot pin array 202 in wax is illustrated. Potting is performed by placing the array 202 in a plastic cylindrical form 302 with a stepped cap 304 that is press fit into one end of the form 302. The pin array 202 was polished by hand with a sequence of abrasive papers, such as silicon carbide and aluminum oxide abrasive papers, sold by 3M Abrasive Systems Division, St. Paul, Minn. Polishing was performed with water and detergent solution on the abrasive paper, this reduced loading of the abrasive paper with wax. After polishing was finished the potted pin array 202 was placed on a support in a shallow dish in an oven at 200° C. until the wax had melted and flowed off the pin array 202. The remaining wax film was removed by soaking the pin array 202 in toluene at 80° C. for 20 minutes followed by soaking in Summa Clean at 80° C. for 5 minutes.

Next the pin surfaces 208 and 210 are chemically treated as indicated in a block 116. To make the shaft 210 of the pins 204 hydrophobic, the pin array 202 was etched in Buffered Oxide Etch, 10:1 $NH_4F$:HF, sold by Ashland Chemicals, Columbus, Ohio, for 5 minutes to expose the silicon. The tip surfaces 208 were made hydrophilic by applying a drop of $HNO_3$ (70%) to the flat surface of the tip to form a thin oxide layer. The $HNO_3$ drop was left in contact with the tip 208 for 30 seconds and then rinsed with deionized water.

Figure 5:
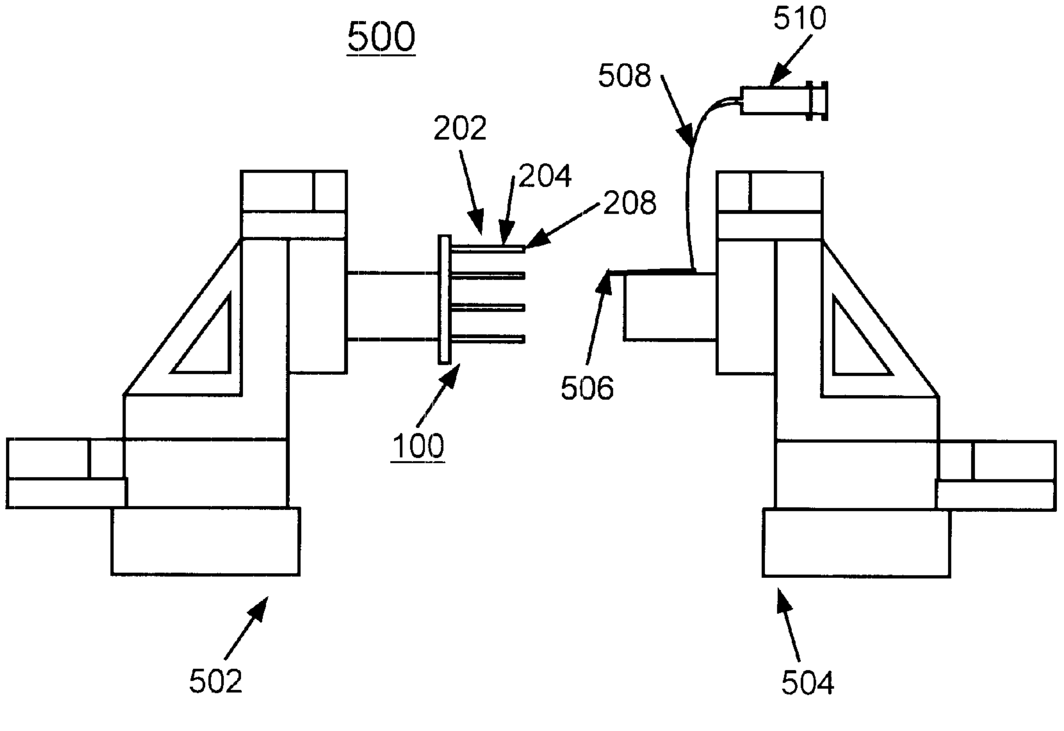
FIG. 5 is a diagram illustrating exemplary apparatus for chemically treating pin surfaces in accordance with the preferred embodiment.

Referring also to FIG. 5, apparatus 500 for applying $HNO_3$ to the pin tips 208 is illustrated. Applying $HNO_3$ to the pin tips 208 was done by clamping the pin array assembly 100 in a micropositioner 502 with the pins 204 of pin array 202 disposed horizontally. A second micropositioner 504 held a 100 $\mu$l pipette tip 506 horizontally which was attached with tubing 508 to a syringe 510. Under magnification, such as 20× magnification, a drop of $HNO_3$ was formed at the pipette tip 506 and the drop and pin tip 208 were brought together. When done correctly the drop wets only the tip 208 of the pin 204.

In brief summary, silicon pin arrays 202 with 11 mm deep silicon features were successfully fabricated by a combination of mechanical sawing, chemical etching, and mechanical polishing. A novel dipping apparatus 400 was designed, built, and used successfully to create a tapered etch profile. FC-99 is a surfactant that is able to withstand concentrated acids and is an effective method to reduce surface irregularities when etching silicon. It is possible to make the pin tips 208 hydrophilic by oxidation with $HNO_3$ (70%). Although all literature examined to date describes HF, $HNO_3$ mixtures to etch all silicon crystal orientations isotropically, it was discovered that a well known "isotropic" etch solution has distinct anisotropic properties.

While the present invention has been described with reference to the details of the embodiments of the invention shown in the drawing, these details are not intended to limit the scope of the invention as claimed in the appended claims.

What is claimed is:

1. A method of manufacture of a pin array assembly comprising the steps of:

forming an initial shape of a single crystal silicon wafer to define a base and an array of pins;

etching said initial shape of a single crystal silicon wafer to form a taper;

dipping said pin array into a second etch solution; and polishing said array of pins.

2. A method of manufacture of a pin array assembly as recited in claim 1 wherein the step of forming an initial shape of a single crystal silicon wafer to define a base and an array of pins includes the step of mechanically sawing said single crystal silicon wafer to define said base and said array of pins.

3. A method of manufacture of a pin array assembly as recited in claim 1 further includes the step of cleaning said formed base and said array of pins.

4. A method of manufacture of a pin array assembly as recited in claim 3 further includes the step of attaching an $Al_2O_3$ substrate to said formed base.

5. A method of manufacture of a pin array assembly as recited in claim 1 wherein the step of etching said array of pins to form a taper includes the step of etching said array of pins in a 2 parts HF (49%), 38 parts $HNO_3$ (70%), 17 parts $CH_3COOH$ (99.5%), by volume, isotropic etching solution, for a predefined period of time.

6. A method of manufacture of a pin array assembly as recited in claim 5 wherein said predefined period of time is about 15 minutes.

7. A method of manufacture of a pin array assembly as recited in claim 1 wherein the step of dipping said pin array into a second etch solution includes the step of dipping the ends of the pins into an etch solution of 1 part $CH_3COOH$ (99.5%), 4 parts HF (49%), 35 parts $HNO_3$ (70%).

8. A method of manufacture of a pin array assembly as recited in claim 7 wherein the step of dipping the ends of the pins into an etch solution of 1 part $CH_3COOH$ (99.5%), 4 parts HF (49%), 35 parts $HNO_3$ (70%) includes the step of dipping said pin array to a selected depth at a set rate for a predefined time period.

9. A method of manufacture of a pin array assembly as recited in claim 8 wherein said selected depth at a set rate for a predefined time period includes a depth of about 5 mm at a rate of about 40 dips/minute for about 12 minutes.

10. A method of manufacture of a pin array assembly as recited in claim 1 wherein the step of dipping said pin array into a second etch solution includes the step of utilizing a motor driven pin array holder for dipping said pin array to a selected depth at a set rate for a predefined time period.

11. A method of manufacture of a pin array assembly as recited in claim 1 wherein the step of polishing said array of pins includes the steps of potting said array of pins in wax and polishing tips of said pins.

12. A method of manufacture of a pin array assembly as recited in claim 11 wherein the step of polishing tips of said pins includes the step of polishing with water and detergent solution on an abrasive paper.

13. A method of manufacture of a pin array assembly as recited in claim 1 further includes the step of chemically treating said polished pins.

14. A method of manufacture of a pin array assembly as recited in claim 13 wherein the step of chemically treating said polished pins includes the step of making shafts of said pins hydrophobic.

15. A method of manufacture of a pin array assembly as recited in claim 14 wherein the step of making shafts of said pins hydrophobic includes the step of etching said shafts in a Buffered Oxide Etch, 10:1 $NH_4F$:HF for a set time period to expose the silicon material.

16. A method of manufacture of a pin array assembly as recited in claim 13 wherein the step of chemically treating said polished pins includes the step of making a tip surface of said pins hydrophilic.

17. A method of manufacture of a pin array assembly as recited in claim 14 wherein the step of making said tip surface of said pins hydrophilic includes the steps of applying a drop of $HNO_3$ (70%) to said tip surface to form a thin oxide layer; and rinsing with de-ionized water.

* * * * *